(12) United States Patent
Gries et al.

(10) Patent No.: US 8,766,584 B2
(45) Date of Patent: Jul. 1, 2014

(54) SYSTEM AND METHOD FOR MANAGING DC LINK SWITCHING HARMONICS

(75) Inventors: Mark A. Gries, Milwaukee, WI (US); Mark R. Cooper, Eden Prairie, MN (US); Rangarajan Tallam, Germantown, WI (US); Garrett B. Rodrigues, San Carlos, CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 378 days.

(21) Appl. No.: 13/295,690

(22) Filed: Nov. 14, 2011

(65) Prior Publication Data

US 2013/0119902 A1   May 16, 2013

(51) Int. Cl.
*H02P 29/02* (2006.01)
(52) U.S. Cl.
USPC ............................ 318/636; 318/455; 318/558
(58) Field of Classification Search
USPC ......... 318/434, 452–455, 558, 565, 600, 625, 318/636, 650
See application file for complete search history.

(56) References Cited

U.S. PATENT DOCUMENTS

| | | | | |
|---|---|---|---|---|
| 4,508,996 A * | 4/1985 | Clegg et al. | .................. | 315/224 |
| 6,198,613 B1 * | 3/2001 | Rozman | ...................... | 361/93.1 |
| 6,404,655 B1 * | 6/2002 | Welches | ......................... | 363/41 |
| 7,164,242 B2 | 1/2007 | Federman et al. | | |
| 7,392,143 B2 * | 6/2008 | Jayabalan et al. | .............. | 702/60 |
| 2003/0228503 A1 | 12/2003 | Georgii | | |
| 2011/0049994 A1 | 3/2011 | Hiller et al. | | |

* cited by examiner

*Primary Examiner* — Bentsu Ro
(74) *Attorney, Agent, or Firm* — Boyle Fredrickson, S.C.

(57) ABSTRACT

A distributed motor drive system includes a power management module and multiple inverter modules integrated with the motors and located on a machine or process remote from the power management module. The power management module distributes DC voltage and command signals to each of the inverters, where the DC voltage is distributed between modules via a DC link cable. The integrated inverters execute switching routines to convert the DC voltage to an AC voltage suitable for controlling the motor. Each of the power management module and the inverters includes a portion of the DC bus. The current on the DC link cable is monitored and general bus utilization as well as overload conditions are reported.

20 Claims, 5 Drawing Sheets

SYSTEM AND METHOD FOR MANAGING DC LINK SWITCHING HARMONICS

BACKGROUND OF THE INVENTION

The subject matter disclosed herein relates generally to a distributed motor drive system and, more specifically, to a system and method for managing harmonic currents present on a direct current (DC) link in a distributed motor drive system.

Alternating current (AC) motors receive an AC voltage at the stator of the motor. The speed and torque of the motor are controlled by varying the amplitude and frequency of this AC voltage applied to the stator. In order to provide varying AC voltage waveforms, a motor controller rapidly switches solid state devices on and off at a predetermined switching frequency and, thereby, alternately connects or disconnects the terminals of the motor to a DC voltage. By varying the duration during each switching period for which the terminal of the motor is connected to the DC voltage, the magnitude of the output voltage is varied. The motor controller utilizes modulation techniques such as pulse width modulation (PWM) to control the switching and to synthesize waveforms having desired amplitudes and frequencies.

Industrial applications which utilize servo motors, such as a process line with multiple stations, a machining center, or an industrial robotic arm, often have multiple axes of control. Each axis requires a motor and a controller to regulate, for example, the speed, position, or torque of the motor. The motors are necessarily positioned along the process line or about the machine as needed to actuate a specific motion. The motor controllers are typically located within one or more enclosures at a common location. However, developments in the power electronic devices used to control the motor have reduced the size of the components. This reduction in size of the power electronic devices along with a desire to reduce the size of the control enclosures have led to placing at least a portion of the motor controller electronics on the motor itself.

Such integrated motor and motor controller systems have not been fully met without incurring various disadvantages. According to one such system, the entire motor controller has been mounted on the motor. However, even with the reduction in size of the power electronic components, including the converter, inverter, and DC bus capacitance on the motor still requires a considerable amount of space, especially as the current rating of the motor increase. Further, the heat generated by both the converter and inverter power electronics must be dissipated at the motor.

According to another system for integrating the motor and motor controller, only the inverter section of the motor controller is mounted on the motor. The rectifier section and DC bus capacitance remains in the control enclosure. Although this system reduces the space required on the motor and also reduces the amount of heat that must be dissipated at the motor, another drawback arises. The inverter section receives a DC voltage via a DC link cable from a DC bus output of the rectifier section in the control enclosure. Although a small amount of capacitance may be connected across the DC link at the inverter section, modulation of the solid state devices in the inverter produces harmonic currents at multiples of the inverter switching frequency, which are, subsequently, conducted on the DC link between the inverter section and the control enclosure.

Another disadvantage in such a system is that the DC link cable extending between the control enclosure and the inverter section can establish a resonant frequency as a function of the length of the DC link cable. If the length of the DC link cable is selected such that the resonant frequency is close to the switching frequency of the inverter, the harmonic current on the DC link may be amplified. To avoid amplification of the harmonic current specific lengths of the DC link cable may be required. Alternately, to compensate for the harmonic content the size of the conductor is increased or the current rating of the conductor is reduced. Each of these options introduces an undesirable cost or limitation in the system.

BRIEF DESCRIPTION OF THE INVENTION

The subject matter disclosed herein describes a distributed motor drive system which includes a power management module and multiple inverter modules integrated with the motors and located on a machine or process remote from the power management module. The power management module distributes DC voltage and command signals to each of the inverter modules. The DC voltage is distributed between modules via a DC link cable. The integrated inverters execute switching routines to convert the DC voltage to an AC voltage suitable for controlling the motor. The power management module and each of the inverter modules includes a portion of the DC bus capacitance. The current on the DC link cable is monitored and general bus utilization as well as overload conditions are reported.

According to a first embodiment of the invention, a method for managing a current on a conductor linking a DC bus of a power management module and a DC bus of at least one remote inverter module is disclosed. The current includes at least one harmonic component and is sampled at a first sampling rate with a current sensor. A root mean square (rms) value of the current sampled at the first sampling rate is determined and compared against a first threshold. A first output signal is generated if the rms value of the current sampled at the first sampling rate is greater than the first threshold and is reset if the rms value of the current sampled at the first sampling rate is less than the first threshold. The amplitude of the current present on the DC bus of the power management module is sampled at a second sampling rate slower than the first sampling rate. A rms value of the current sampled at the second sampling rate is determined, and a second output signal, corresponding to the utilization rate of the DC bus of the power management module as a function of the rms value of the current sampled at the second sampling rate, is generated.

According to another embodiment of the invention, a method for managing at least one harmonic component of a current on a DC bus of a power management module connected to at least one remote inverter module samples at a first sampling rate an input signal corresponding to an amplitude of the current present on the DC bus of the power management module. A root mean square (rms) value of the current sampled at the first sampling rate is determined. The rms value of the current sampled at the first sampling rate is downsampled to a second sampling rate slower than the first sampling rate, and a rms value of the current is determined at the second sampling rate. A utilization rate of the DC bus of the power management module is determined as a function of the rms value of the current sampled at the second sampling rate.

According to still another embodiment of the invention, a system for controlling a plurality of motors distributed about an industrial machine or process includes a rectifier section configured to receive an AC voltage input and to convert the AC voltage input to a DC voltage. A local DC bus receives the DC voltage from the converter section, and a first capacitance is connected across the local DC bus. A plurality of motor control modules, are each mounted to one of the motors and further include a remote DC bus connected to the local DC bus via at least one DC link cable, a second capacitance smaller than the first capacitance connected across the remote DC bus, and an inverter section including a plurality of switches converting the DC voltage to an AC voltage suitable for controlling the motor. The system also includes an inductance connected in series between the local DC bus and the remote DC bus of a first of the motor control modules, and a current sensing device, sampling the current present on the local DC bus at a first sampling frequency and generating a corresponding signal. A processor configured to execute a stored program executes to compare the signal from the current sensing device against a first threshold.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
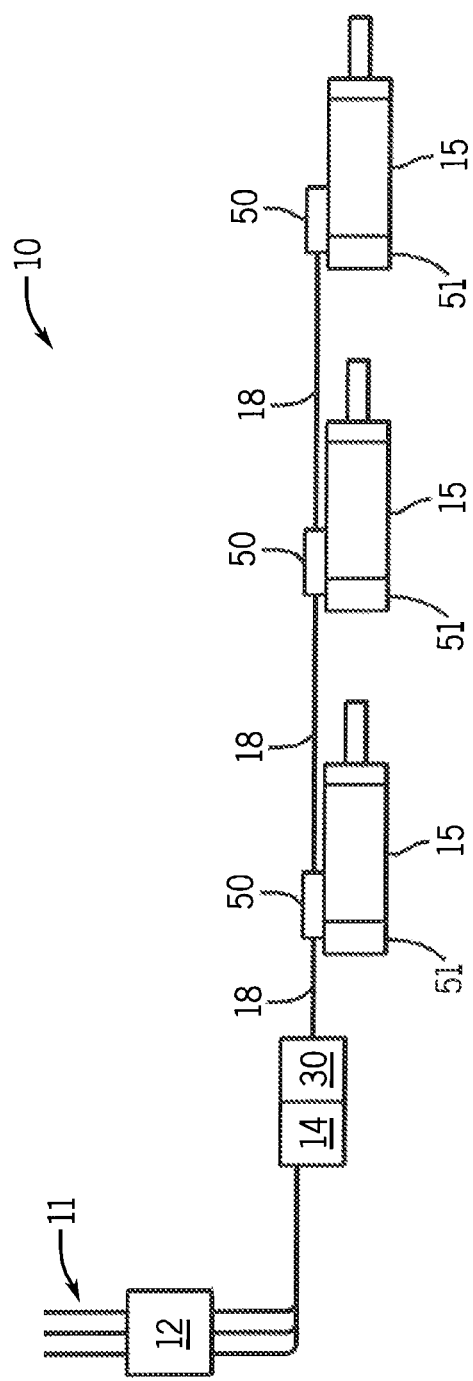
FIG. 1 is an exemplary distributed motor system according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

Turning initially to FIG. 1, a distributed motor control system 10 according to one embodiment of the invention is disclosed. An input voltage 11 is connected to a converter module 14 via a suitable disconnect 12, such as a fuse block or a circuit breaker. The input power 11 may be any suitable power supply such as three phase or single phase AC voltage, according to the application requirements. The converter module 14 converts the AC voltage into a DC voltage for distribution by the power management module 30. The converter module 14 and power management module 30 are mounted together in a control enclosure positioned near a machine or industrial process to be controlled. It is contemplated that the converter module 14 and the power management module 30 may either be separate modules or integrated as a single module without deviating from the scope of the invention. Further, separate modules may be connected, for example, by electrical conductors or by a backplane connection in a rack-style enclosure. The connection may be used to transmit both power and control signals between modules. Optionally, a DC voltage may be provided directly to the power management module 30 via the disconnect 12.

The power management module 30 is connected in series with each power delivery module, also referred to herein as an inverter module 50. A cable 18 extends between the power management module 30 and a first of the inverter modules 50 as well as between subsequent inverter modules 50. The cable 18 includes all necessary connections to transmit, for example, power, reference commands, and/or network communications between each series connected inverter module 50. The cable may similarly include feedback signals from the inverter module 50 to the power management module 30. The cable 18 may include multiple conductors contained within a single jacket and appropriate shielding, separate conductors for each of the electrical connections, or a combination thereof.

Each power delivery module 50 is mounted to a motor 15. Each motor 15 is mounted remotely from the control enclosure and connected to the machine or industrial process being controlled. The power delivery modules 50 include housings connected to the motor housing, for example, by bolts or which are, optionally, integrally formed with the corresponding motor housing. The voltage output to each motor 15 from the power delivery module 50 may be either a single or multi-phase AC output voltage according to the requirements of the motor 15. Optionally, each motor 15 may include a position sensor 51 such as an encoder or a resolver providing a signal corresponding to the angular position of the motor 15.

Figure 2:
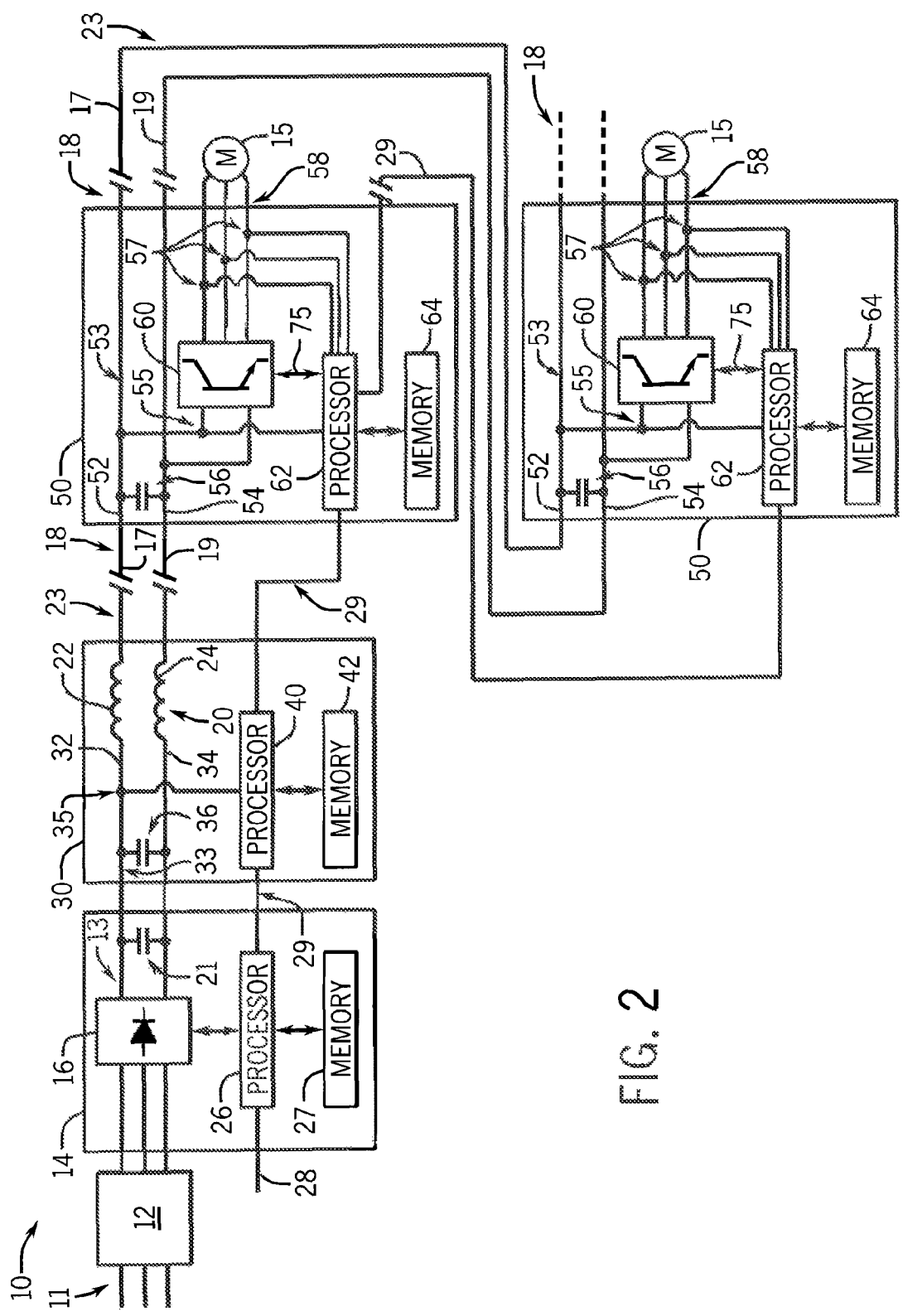
FIG. 2 is a block diagram representation of an exemplary distributed motor system according to one embodiment of the invention.

Referring next to FIG. 2, the converter module 14 includes a rectifier section 16, connected in series between the input voltage 11 and a DC bus 13, and a first DC bus capacitor 21 connected across the DC bus 13. It is understood that the DC bus capacitor 21 may be a single capacitor or multiple capacitors connected in parallel, in series, or a combination thereof. The rectifier section 16 may be either passive or active, where a passive rectifier utilizes electronic devices such as diodes, which require no control signals, and an active rectifier utilizes electronic devices including, but not limited to, transistors, thyristors, and silicon controlled rectifiers, which receive switching signals to turn on and/or off. The converter module 14 also includes a processor 26 and a memory device 27. It is contemplated that the processor 26 and memory device 27 may each be a single electronic device or formed from multiple devices. Optionally, the processor 26 and/or the memory device 27 may be integrated on a field programmable array (FPGA) or an application specific integrated circuit (ASIC). The processor 26 may send or receive signals to the rectifier section 16 as required by the application requirements. The processor 26 is also configured to communicate with external devices via an industrial network 28, including but not limited to, DeviceNet, ControlNet, or Ethernet/IP and its respective protocol. The processor 26 further communicates with other devices within the motor control system 10 via any suitable communications medium 29, such as a backplane connection or an industrial network, which may further include appropriate network cabling and routing devices.

The power management module 30 is connected in series with the converter module 14. Electrical connections are established between the DC bus 13 of the converter module 14 and a DC bus 33 in the power management module 30 to transfer the DC bus voltage between modules. The connections may be made via a backplane connection, a power bus, or via a DC link cable 23. Alternately, if the two modules are integrated, the two DC busses, 13 and 33, may be combined into a single DC bus. The DC bus 33 includes a first voltage rail 32 and a second voltage rail 34. Each of the voltage rails, 32 or 34, are configured to conduct a DC voltage having a desired potential, according to application requirements. According to one embodiment of the invention, the first voltage rail 32 may have a DC voltage at a positive potential and the second voltage rail 34 may have a DC voltage at ground potential. Optionally, the first voltage rail 32 may have a DC voltage at ground potential and the second voltage rail 34 may have a DC voltage at a negative potential According to still another embodiment of the invention, the first voltage rail 32 may have a first DC voltage at a positive potential with respect to the ground potential and the second voltage rail 34 may have a second DC voltage at a negative potential with respect to the ground potential. The resulting DC voltage potential between the two voltage rails, 32 and 34, is the difference between the potential present on the first rail 32 and the second rail 34.

The power management module 30 further includes a processor 40 and a memory device 42. It is contemplated that the processor 40 and memory device 42 may each be a single electronic device or formed from multiple devices. Optionally, the processor 40 and/or the memory device 42 may be integrated on a field programmable array (FPGA) or an application specific integrated circuit (ASIC). The processor 40 in the power management module 30 is in communication with the processor 26 in the converter module 14 via the communications medium 29. The communications medium 29 may be integrated into a backplane connection, integrated with the DC link cable 23 as a single cable, or provided as a separate network cable. The power management module 30 also includes at least one sensor 35 connected to the DC bus 33 and in communication with the processor 40. Each sensor 35 provides a signal to the processor corresponding to an operating condition, such as the amplitude of the voltage or current present on the DC bus 33.

A DC link inductance 20 is mounted within the power management module 30 and connected in series with the DC link cable 23 to a power delivery module 50. Optionally, the inductance 20 may be mounted external to the power management module 30. According to one embodiment of the invention, the DC link inductance includes a first inductor 22 connected in series between the positive voltage rails, 32 and 52, of the power management module 30 and the power delivery module 50, respectively, and a second inductor 24 connected in series between the negative voltage rails, 34 and 54, of the power management module 30 and the power delivery module 50, respectively.

According to one embodiment of the invention, the DC bus 53 of the first power delivery module 50 is connected in series with the DC bus 33 of the power management module 30 and the DC bus 53 of subsequent power delivery modules 50 are connected in series with the DC bus 53 of the preceding power delivery module 50. Electrical connections are established between the DC bus 53 of each power delivery module 50 and its preceding module via a DC link cable 23 to transfer the DC bus voltage between modules. Similar to the DC bus 33 in the power management module 30, the DC bus 53 in the power delivery module 50 includes a first voltage rail 52 and a second voltage rail 54. Each of the voltage rails, 52 or 54, are configured such that they may conduct a DC voltage having the same potential as the voltage rails, 32 or 34, in the power management module 30.

The power delivery module 50 further includes a processor 62 and a memory device 64. It is contemplated that the processor 62 and memory device 64 may each be a single electronic device or formed from multiple devices. Optionally, the processor 62 and/or the memory device 64 may be integrated on a field programmable array (FPGA) or an application specific integrated circuit (ASIC). The processor 62 in each power delivery module 50 is in communication with preceding module via the communications medium 29. The communications medium 29 and the DC link cable 23 define, at least in part, the cable 18 extending between modules. The power delivery module 50 also includes at least one sensor 55 connected to the DC bus 53 and in communication with the processor 40. Each sensor 55 provides a signal to the processor corresponding to an operating condition, such as the amplitude of the voltage or current present on the DC bus 33. At least one additional sensor 57 is connected to the output of the inverter section 60 and provides a signal to the processor 62 corresponding to the current in one of the phases of the AC output voltage to the motor 15.

Figure 3:
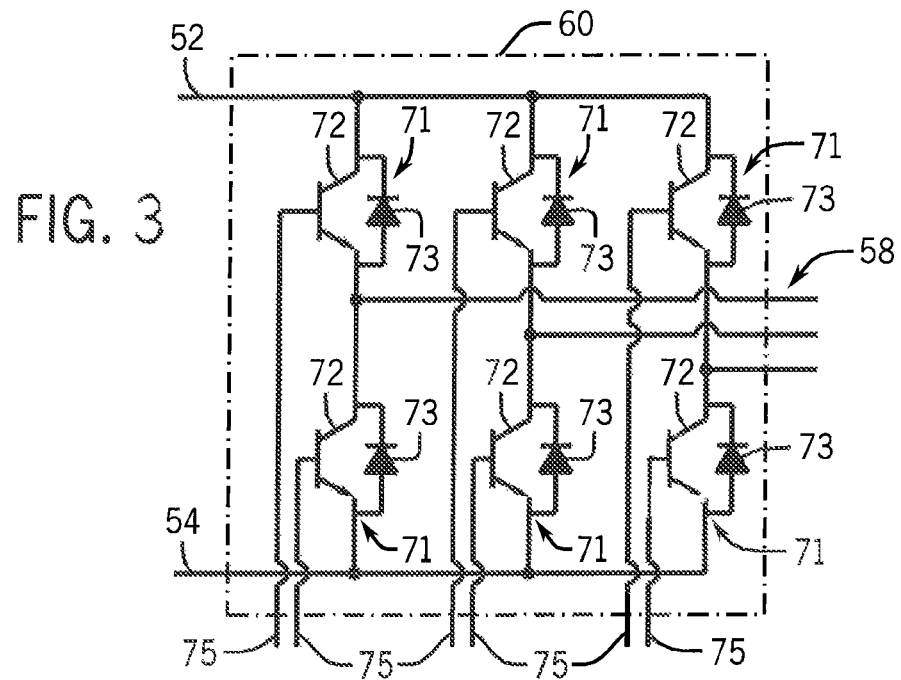
FIG. 3 is a schematic representation of an inverter section from FIG. 2.

A DC bus capacitor 56 is connected between the positive and negative rails, 52 and 54, to reduce the magnitude of the ripple voltage present on the DC bus 53. It is understood that the DC bus capacitor 56 may be a single capacitor or multiple capacitors connected in parallel, in series, or a combination thereof. The magnitude of the voltage potential between the two voltage rails, 52 and 54, is generally about equal to the magnitude of the peak of the AC input voltage 11. The DC voltage on the DC bus 53 is converted to an AC voltage by an inverter section, 60. According to one embodiment of the invention, the inverter section 60 converts the DC voltage to a three-phase output voltage available at an output terminal 58 connected to the motor 15. The inverter section 60 includes multiple switches 71 which selectively connect one of the output phases to either the positive voltage rail 52 or the negative voltage rail 54. Referring also to FIG. 3, each switch 71 may include a transistor 72 and a diode 73 connected in parallel to the transistor 72. Each switch 71 receives a switching signal 75 to enable or disable conduction through the transistor 72 to selectively connect each phase of the output terminal 58 to either the positive voltage rail 52 or the negative voltage rail 54 of the DC bus 53.

In operation, the converter module 14 receives an AC input voltage 11 and converts it to a DC voltage with the rectifier section 16. The AC input voltage 11 may be either a three phase or a single phase AC voltage. If the rectifier section 16 is an active rectifier, the processor 26 will receive signals from the active rectifier corresponding to, for example, amplitudes of the voltage and current on the AC input and/or the DC output. The processor 26 then executes a program stored in memory 27 to generate switching signals to activate and/or deactivate the switches in the active rectifier, where the program includes a series of instructions executable on the processor 26. In addition, the switching signals may be generated such that power is transferred in either direction between the AC input and the DC output. Whether there is a passive rectifier or an active rectifier, the DC bus capacitor 21 connected across the DC bus 13 reduces the ripple voltage resulting from the voltage conversion. The DC voltage from the DC bus 13 of the converter module 14 is then provided to the DC bus 33 of the power management module 30.

The processor 26 of the converter module 14 may further be configured to communicate with other external devices via the industrial network 28. The processor 26 may receive command signals from a user interface or from a control program executing, for example, on a programmable logic controller. The command signals may include, but are not limited to, speed, torque, or position commands used to control the rotation of each motor 15 in the distributed control system 10. The processor 26 may either pass the commands directly or execute a stored program to interpret the commands and subsequently transmit the commands to each inverter module 50. The processor 26 communicates with the processors, 40 or 62, of the power management module 30 and the inverter modules 50, directly or via a daisy chain topology and suitable communications media 29. Further, the processor 26 may either communicate using the same network protocol with which it received the commands via the industrial network 28 or convert the commands to a second protocol for transmission to subsequent modules, 30 or 50.

The power management module 30 transfers the DC voltage and the control signals received from the converter module 14 to each power delivery module 50. The series connection of the DC bus 33 of the power management module 30 between the DC bus 13 of the converter module 14 and the DC bus 53 of the first power delivery, or inverter, module 50 establishes an electrical conduction path for the DC voltage between the converter module 14 and the inverter module 50. The DC bus capacitor 36 in the power management module 30 further reduces the ripple voltage on the DC bus resulting from voltage conversion. Optionally, the power management module 30 and the converter module 14 may be integrated as a single unit, resulting in the combination of DC busses 13 and 33 into a single DC bus and the combination of DC bus capacitors, 21 and 36, into a single capacitance. The processor 40 receives a signal from at least one sensor 35 corresponding to the amplitude of the current and/or voltage present on the DC bus 33. Further, the processor 40 samples the amplitude of the current from the sensor 35 at a fast enough rate to monitor the amplitude of harmonic currents present on the DC bus 33.

Each power delivery module 50 converts the DC voltage from the DC bus 53 to an AC voltage suitable to control operation of the motor 15 on which it is mounted. The processor 62 executes a program stored on a memory device 64. The processor 62 receives a reference signal via the communications medium 29 identifying the desired operation of the motor 15. The program includes a control module configured to control the motor 15 responsive to the reference signal and to feedback signals, including but not limited to signals from the voltage sensor 55, the current sensors 57, and the position sensor 51. The control module generates a desired voltage reference signal 104, see also FIG. 4. The program further includes a switching module using, for example, pulse width modulation (PWM) to generate switching signals 75 to control the switches 71 responsive to the desired voltage reference signal 104.

Figure 4:
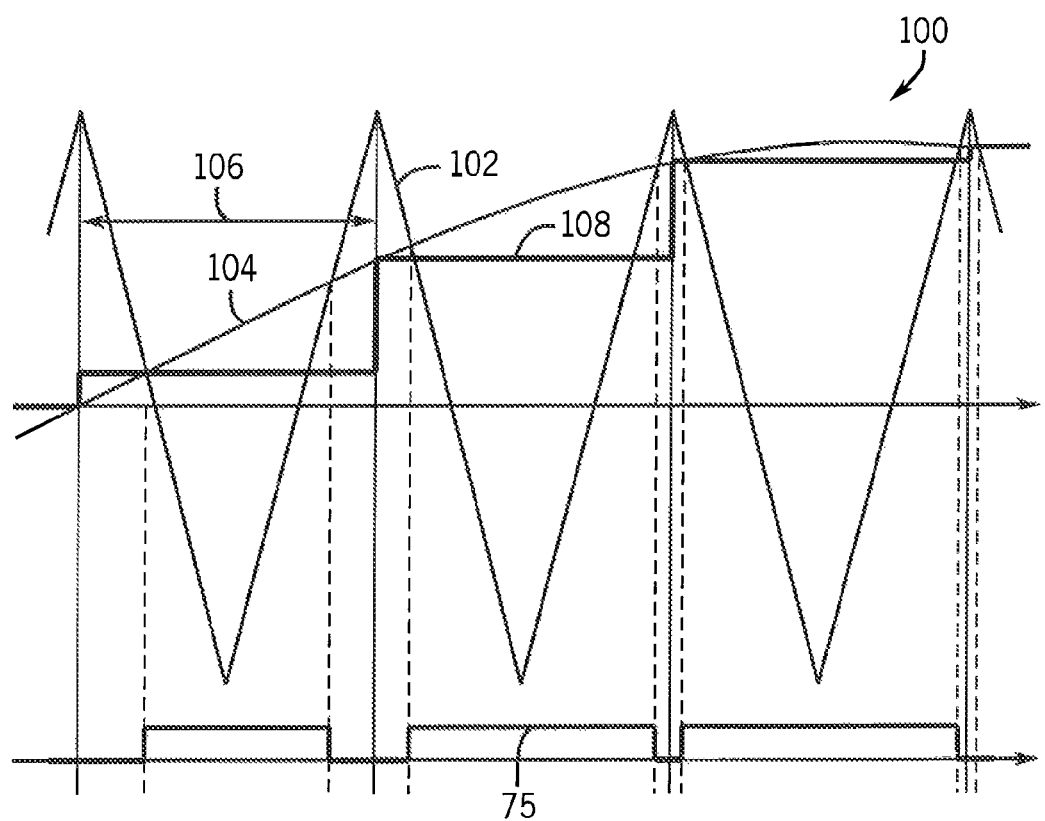
FIG. 4 is a graphical representation of a segment of one phase of an AC voltage output by an inverter section according to a PWM routine.
Figure 5:
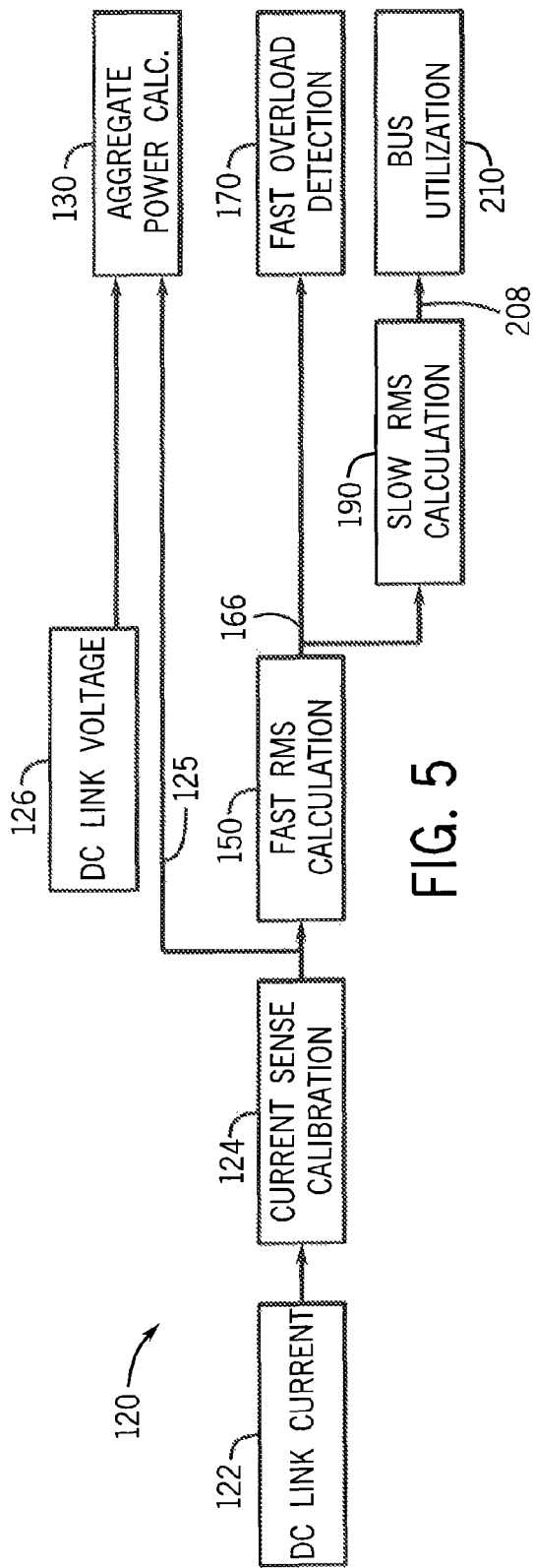
FIG. 5 is a block diagram representation of one embodiment of a current monitoring system according to the present invention.
Figure 6:
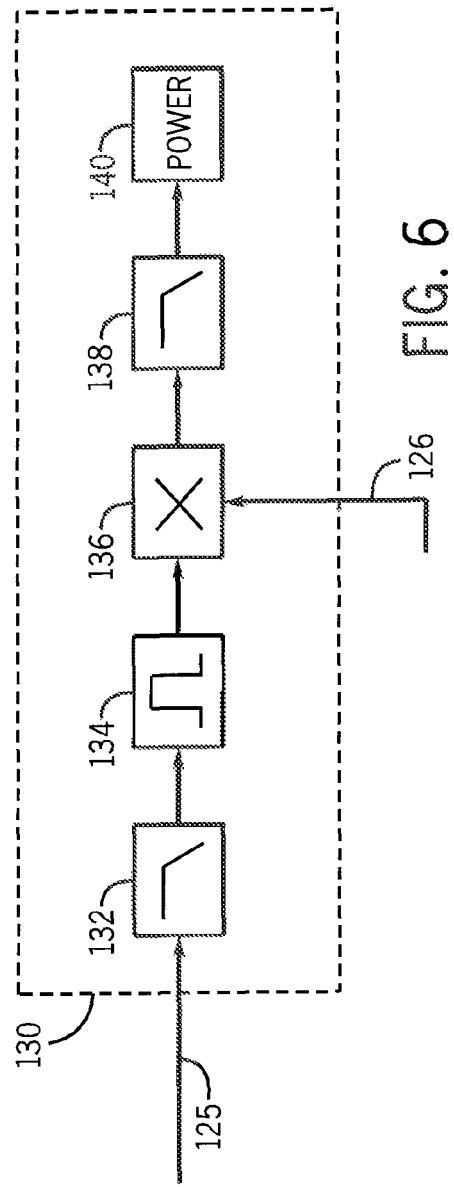
FIG. 6 is a block diagram representation of the aggregate power calculation module as shown in FIG. 5.
Figure 7:
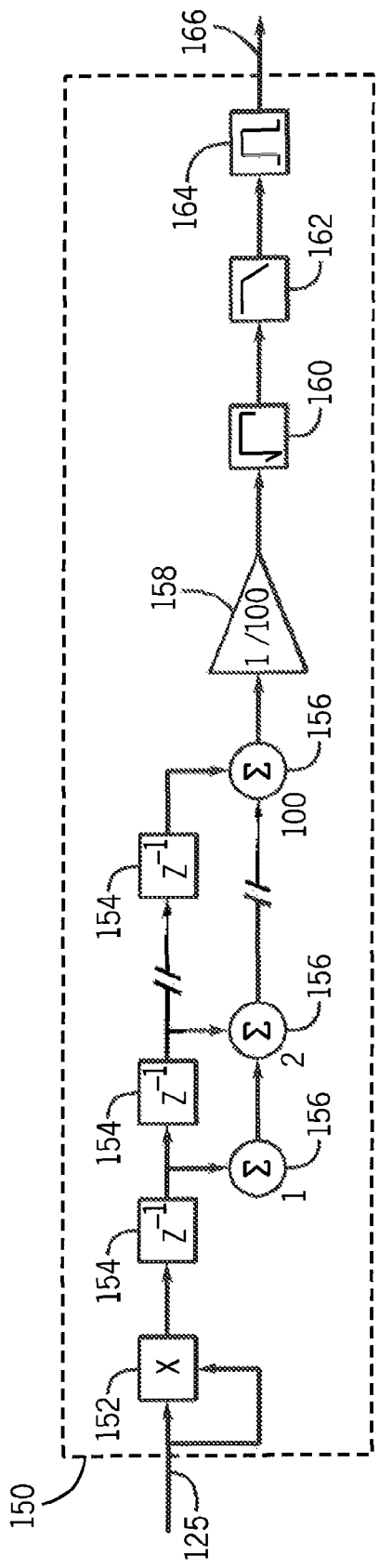
FIG. 7 is a block diagram representation of the fast rms calculation module as shown in FIG. 5.
Figure 8:
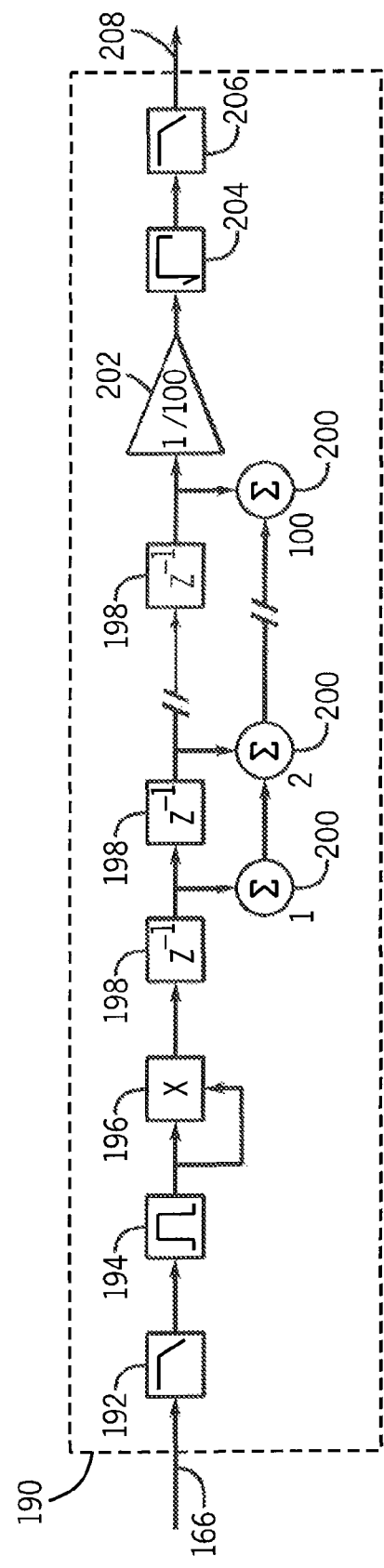
FIG. 8 is a block diagram representation of the slow rms calculation module as shown in FIG. 5.

Referring next to FIG. 4, a segment of one phase of an AC voltage output according to an exemplary sine-triangle PWM modulation technique 100 is illustrated. In the sine-triangle PWM modulation technique 100, a triangular waveform 102 is compared to the voltage reference 104 to generate switching signals 75. The switching signals 75 control the switches 71 that selectively connect or disconnect each phase of the output terminal 58 to either the positive voltage rail 52 or the negative voltage rail 54. One period of the triangular waveform 102 is defined by the switching period 106 of the PWM routine. During the switching period 106, if the voltage reference 104 is greater than the triangular waveform 102, the switching signal 75 is set high and, if the voltage reference 104 is less than the triangular waveform 102, the switching signal 75 is set low. The resulting output voltage 108 can be represented by a stepped waveform where the magnitude of the stepped waveform during each period 106 is the average value of the output voltage 108 during that period 106. The average value is determined by multiplying the magnitude of the DC voltage present on the DC bus 53 by the percentage of the period 106 that the switching signal 75 is set high. As the switching period 106 of the PWM routine decreases, the stepped output voltage 108 more accurately corresponds to the voltage reference 104. It is contemplated that other modulation techniques, as would be known to one skilled in the art, may also be used to generate the output voltage, such as space-vector or multi-level switching. Further, the modulation techniques may be implemented by comparing analog signals, as shown in FIG. 4; digital signals, such as a register being incremented up and down; or a combination thereof The alternating connection and disconnection of the switches 71 to the DC bus 53 creates a ripple or fluctuation in the amplitude of the current on the DC bus 53. The amplitude and frequency of the ripple may be affected by many factors, including but not limited to the switching frequency and the modulation technique utilized. The modulation of the switches 71 may generate harmonic currents on the DC bus 53, for example, at the frequency, or multiples thereof, of the switching frequency. In addition, the switching routine may introduce harmonic currents at still other frequencies. Although the bus capacitor 56 on the power delivery module 50 helps reduce the ripple and the resulting harmonic currents present on the DC bus 53 in the power delivery module 50, the physical size restraints from mounting the power delivery module 50 on the motor 15 restrict the amount of capacitance that may be included in the power delivery module 50, which, in turn, restricts the effectiveness of the capacitance 56 in reducing the harmonic currents.

Although the DC bus capacitor 56 of the power delivery module 50 is connected in parallel with the DC bus capacitors, 21 and 36, of the converter and power management modules, 14 and 30 respectively, increasing the system capacitance, the DC link cable 23 connecting the DC bus 53 of the power delivery module 50 to the DC bus 33 of the power management module 30 may amplify any harmonic current generated by the switches 71 in the power delivery module 50. The DC link cable 23 introduces reactive components, for example a cable inductance, that are a function of the length of the DC link cable 23. Consequently, the amount the current is amplified is a function of the frequency of the harmonic current and the length of the DC link cable 23. Further, the distance the motors 15 and the power delivery modules 50 are located from the central enclosure may vary from one or two meters up to hundreds of meters.

The inductance 20 mounted in series with the DC link cable 23 is configured to mitigate the harmonic currents present in the distributed motor control system 10. The magnitude of the inductance 20 is selected to attenuate harmonic content at the lowest frequency of harmonic current expected in the distributed motor control system 10. As previously discussed, the harmonic currents on the DC link cable 23 are a function of the switching frequency, the modulation technique, the length of the DC link cable 23, and the size of the capacitance 56 present in the power delivery module 50. According to one exemplary embodiment of the invention, a modulation technique is selected which, for example, results in 2nd and 4th harmonic content being present on the DC link cable 23. If the switching frequency is selected at 2 kHz, the resulting harmonic currents would have frequencies at 4 and 8 kHz. The magnitude of the inductance is selected such that the resulting DC link impedance attenuates the 4 kHz harmonic current to an acceptable level. According to another exemplary embodiment of the invention, the harmonic currents generated are a function of the modulation technique implemented. Again, the magnitude of the inductance is selected such that the resulting DC link impedance attenuates the harmonics generated from the modulation technique to an acceptable level. Preferably, the attenuation results in about a 0 dB gain of the harmonic currents.

Although attenuated, the harmonic content on the DC link cable 23 is not eliminated. Referring to FIGS. 5-8, one embodiment of monitoring and managing the harmonic currents resulting from the switching of the inverter modules 50 is illustrated. The processor 40 in the power management module 30 receives an input signal corresponding to the amplitude of the DC link current 122. Optionally, another processor in the motor control system 10, or a processor in an external processing device, including but not limited to a programmable logic controller (PLC) or a remote computer, may receive the signal. The input signal is sampled at a rate fast enough to measure the harmonic content present. The sampling frequency may be, for example, an order of magnitude greater than the highest expected harmonic current. Thus, the processor 40 is configured to read the signal from the sensor 35 corresponding to the amplitude of the current on the DC bus 33 at a rate fast enough to monitor the harmonic current present.

A calibration module 124 applies an offset and scaling factor as needed according to the system requirements. The calibration module 124 may be implemented by a stored program executing on the processor 40 to add an offset to a digital value corresponding to the DC link current 122 or, optionally, may be implemented via an analog circuit which offsets the signal corresponding to the DC link current 122 prior to inputting the signal to the processor 40.

The calibrated current signal 125 is used by an aggregate power calculation module 130 to determine the power consumed by the chain of power delivery modules 50 and motors 15 connected in series with the power management module 30. The calibrated current signal 125 is first sent through a low pass filter module 132 to eliminate the harmonic content. The bandwidth of the filter is preferably selected to output a signal corresponding to an average value of the DC link current having a response time comparable to the DC link voltage. The filtered current is passed through a down sampling block 134 such that the new frequency of the sampled current corresponds to the frequency at which the voltage on the DC bus 33 is sampled. The down sampling block 134 selects every nth data point from data sampled at a first frequency to obtain data at a second, lower frequency, where the value of "n" is selected according to the desired ratio between the original sampling frequency and the reduced sampling frequency. The down sampled current and the sampled DC voltage are passed through a multiplying block 136, which outputs the aggregate power consumed by the chain of power delivery modules 50. The aggregate power is finally passed through an anit-aliasing filter 138. The bandwidth of the anti-aliasing filter is selected as a function of the number and of the sampling frequency of the power delivery modules 50 connected to the DC bus 33. The calculated value of the aggregate power may be provided as an output 140, for example, to a display for monitoring by an operator. Optionally, the aggregate power may be stored locally or remotely in a fixed or removable memory device or provided as an output 140 to another device for display or storage.

The calibrated current signal 125 is also used by a first filter module, for example, a fast root mean square (rms) calculation module 150 to determine a time-averaged current signal which includes both the real and harmonic current components. According to one embodiment of the invention, the calibrated current signal 125 enters a multiplying block 152 which first multiplies the signal against itself, or squares the signal. The squared signal is passed through a series of delay blocks 154 and summing junctions 156 which form, for example, a 100-tap finite impulse response (FIR) filter. Optionally, other lengths of the FIR filter may be selected. The passband of the filter is selected such that the expected harmonic content is included in the rms calculation. The output of the FIR filter enters a gain block 158 to divide the output by the number of taps in the filter, resulting in the mean of the squared current. The mean of the squared current enters a square root block 160 which outputs the rms value of the sampled current. The fast rms calculation module 150 next passes the rms value through an anti-aliasing filter 162 and a down sampling block 164 and generates output 166 for subsequent calculations. It is contemplated that first filter module may be implemented using other suitable filters according to the application requirements.

For example, the output 166 of the fast rms calculation module 150 is provided as an input to a fast overload detection module 170 to determine whether the magnitude of the combined harmonic currents and DC current present on the the DC link cable 23 exceeds a predetermined threshold. The predetermined threshold is selected according to the application requirements and is a function of, for example, the size of the conductors in the DC link cable 23 or applicable industrial standards. If the total current on the DC link cable 23 exceeds the predetermined threshold, the processor 40 generates an output signal, which may be used, for example, to provide a visual or audio alert to an operator or to generate a message to be transmitted to another processor.

The output 166 of the fast rms calculation module 150 is also provided as an input to a second filter module, for example, a slow rms calculation module 190. The input 166 is first passed through a low pass filter block 192 to filter out the harmonic content. The filtered content is subsequently down sampled 194 such that a slower processing task may operate on the sampled current. This filtered current corresponds to an average value of the current present on the DC bus 33. Similar to the fast rms calculation module 150, the filtered current signal enters a multiplying block 196 which first multiplies the signal against itself, or squares the signal. The squared signal is passed through a series of delay blocks 198 and summing junctions 200 which form, for example, a 100-tap finite impulse response (FIR) filter. Optionally, other lengths of the FIR filter may be selected. The output of the FIR filter enters a gain block 202 to divide the output by the number of taps in the filter, resulting in the mean of the squared current. The mean of the squared current enters a square root block 204 which outputs the rms value of the sampled current. The slow rms calculation module 190 next passes the rms value through an anti-aliasing filter 206 and generates output 208 for subsequent calculations. It is contemplated that second filter module may be implemented using other suitable filters according to the application requirements.

For example, the output 208 of the slow rms calculation module 190 is provided as an input to a bus utilization module 210 which monitors the rms current present on the DC bus 33.

The rms current may be provided as an output, for example, to a display for monitoring by an operator. Optionally, the rms current may be stored locally or remotely in a fixed or removable memory device or provided as a signal to another device for display or storage. The rms current may also be compared to a predetermined threshold. The predetermined threshold is selected according to the application requirements and is a function of, for example, the size of the conductors in the DC link cable 23 or applicable industrial standards. If the rms current on the DC bus 33 exceeds the predetermined threshold, the processor 40 generates an output signal, which may be used, for example, to provide a visual or audio alert to an operator or to generate a message to be transmitted to another processor.

The output 208 of the slow rms calculation module 190 may also be utilized to select the DC link inductance 20 in the distributed motor control system 10. A remote processor, such as an industrial controller or separate computer, may execute a program to simulate an input signal corresponding to the amplitude of the current present on the DC bus of the power management module. The simulated current signal includes the harmonic content expected within the system and is input to a model of the distributed motor control system 10 which simulates the damping characteristics of the DC link inductance 20. The output of the system model is then provided as the calibrated current signal 125 input to the blocks monitoring and managing the harmonic current. The output 208 of the slow rms calculation module 190 is then monitored and the value of the DC link inductance 20 within the system model is varied until the output 208, which corresponds to the bus utilization of the distributed motor control system 10 is below a predetermined threshold. Thus, a desired value of the DC link inductance 20 for use in the system may be determined.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A method for managing a current on a conductor linking a DC bus of a power management module and a DC bus of at least one remote inverter module, wherein the current includes at least one harmonic component, comprising the steps of:
    sampling at a first sampling rate an amplitude of the current present on the DC bus of the power management module with a current sensor;
    determining a root mean square (rms) value of the current sampled at the first sampling rate;
    comparing the rms value of the current sampled at the first sampling rate against a first threshold;
    generating a first output signal if the rms value of the current sampled at the first sampling rate is greater than the first threshold and resetting the first output signal if the rms value of the current sampled at the first sampling rate is less than the first threshold;
    sampling the amplitude of the current present on the DC bus of the power management module at a second sampling rate slower than the first sampling rate;
    determining a root mean square (rms) value of the current sampled at the second sampling rate; and
    generating a second output signal corresponding to a utilization rate of the DC bus of the power management module as a function of the rms value of the current sampled at the second sampling rate.

2. The method of claim 1 further comprising the steps of:
    comparing the rms value of the current sampled at the second sampling rate against a second threshold; and
    generating a third output signal if the rms value of the current sampled at the second sampling rate is greater than the second threshold and resetting the third output signal if the rms value of the current sampled at the second sampling rate is less than the second threshold.

3. The method of claim 2 wherein at least one of the first output signal and the third output signal generates a fault condition at the remote inverter module.

4. The method of claim 1 wherein sampling the amplitude of the current present on the DC bus of the power management module at a second sampling rate includes downsampling of the samples obtained at the first sampling rate.

5. The method of claim 1 wherein each remote inverter module is mounted to a motor and includes a switching module, the method further comprising the initial step of selectively connecting the DC bus of the inverter module to at least one conductor of a stator present in the motor at a predetermined switching frequency, wherein:
    at least one harmonic current is generated as a function of selectively connecting the DC bus,
    the harmonic currents are transmitted by the conductor linking the DC bus of the at least one remote inverter module to the DC bus of a power management module, and
    the first sampling rate is greater than the frequency of the at least one harmonic current.

6. The method of claim 5 wherein:
    a DC link inductor is connected in series between the DC bus of the power management module and the DC bus of the at least one remote inverter module, and
    the current sensor samples the current in series between the DC bus of the power management module and the DC link inductor.

7. The method of claim 6 wherein the second sampling rate is less than the frequency of the at least one harmonic current and greater than the frequency of a servo control module configured to execute on a processor in the inverter module.

8. The method of claim 1 wherein a plurality of remote inverter modules are electrically connected to receive power from the power management module further comprising the steps of:
    downsampling the samples of the amplitude of the current present on the DC bus of the power management module at a first sampling rate to a third sampling rate;
    sampling an amplitude of the voltage present on the DC bus of the power management module at the third sampling rate; and
    determining a value of power required by the remote inverter modules as a function of the amplitudes of current and voltage sampled at the third sampling rate.

9. The method of claim 8 wherein the third sampling rate is a function of the number of remote inverter modules connected to the power management module.

10. A method for managing at least one harmonic component of a current on a DC bus of a power management module connected to at least one remote inverter module, comprising the steps of:
sampling at a first sampling rate an input signal corresponding to an amplitude of the current present on the DC bus of the power management module;
determining a root mean square (rms) value of the current sampled at the first sampling rate;
downsampling the rms value of the current sampled at the first sampling rate to a second sampling rate slower than the first sampling rate;
determining a rms value of the current sampled at the second sampling rate; and
generating a utilization rate of the DC bus of the power management module as a function of the rms value of the current sampled at the second sampling rate.

11. The method of claim 10 further comprising the steps of:
comparing the rms value of the current sampled at the first sampling rate against a first threshold;
generating a first overload signal if the rms value of the current sampled at the first sampling rate is greater than the first threshold and resetting the first overload signal if the rms value of the current sampled at the first sampling rate is less than the first threshold;
comparing the rms value of the current sampled at the second sampling rate against a second threshold; and
generating a second overload signal if the rms value of the current sampled at the second sampling rate is greater than the second threshold and resetting the second overload signal if the rms value of the current sampled at the second sampling rate is less than the second threshold.

12. The method of claim 11 wherein the power management module is in communication with a remote industrial controller and wherein after sampling the input signal the method further comprises the step of transmitting the sampled amplitude of the current present on the DC bus to the remote industrial controller and wherein the remote industrial controller includes a processor configured to execute the remaining steps.

13. The method of claim 10 wherein a remote computing device includes a processor configured to execute the steps of the method further comprising the initial step of executing a module on the processor to generate the input signal corresponding to the amplitude of the current present on the DC bus of the power management module.

14. The method of claim 13 wherein the module executing on the processor generates the input signal as a function of an inductance connected in series between the power management module and the remote inverter module.

15. The method of claim 14 wherein the module receives the utilization rate as an input and varies the inductance until the utilization is below a predetermined threshold.

16. A system for controlling a plurality of motors distributed about an industrial machine or process, the system comprising:
a rectifier section configured to receive an AC voltage input and to convert the AC voltage input to a DC voltage;
a local DC bus receiving the DC voltage from the converter section;
a first capacitance connected across the local DC bus;
a plurality of motor control modules, wherein each motor control module is mounted to one of the motors, the motor control module further comprising:
a remote DC bus connected to the local DC bus via at least one DC link cable,
a second capacitance smaller than the first capacitance connected across the remote DC bus, and
an inverter section including a plurality of switches converting the DC voltage to an AC voltage suitable for controlling the motor;
an inductance connected in series between the local DC bus and the remote DC bus of a first of the motor control modules;
a current sensing device sampling the current present on the local DC bus at a first sampling frequency and generating a corresponding signal; and
a processor configured to execute a stored program executes to compare the signal from the current sensing device against a first threshold.

17. The system of claim 16 wherein each of the DC link cables includes a first and a second electrical conductor and wherein the inductance includes a first and a second inductor connected in series with the first and the second electrical conductor, respectively.

18. The distributed motor control system of claim 17
the motor control module further comprises:
an output configured to conduct the AC voltage to the motor; and
a processor configured to execute a series of instructions to generate a plurality of switching signals at a predetermined frequency, wherein the switches in the inverter section are controlled by the switching signals to selectively connect the DC bus to the output and wherein the magnitude of the inductance is a function of the predetermined frequency.

19. The distributed motor control system of claim 18 wherein the processor further executes to:
downsample the current signal to a second sampling rate,
determine a root mean square (rms) value of the current signal at the second sampling rate, and
generate a utilization rate of the DC bus of the power management module as a function of the rms value of the current sampled at the second sampling rate.

20. The distributed motor control system of claim 19 wherein the processor further executes to compare the rms value of the current sampled at the second sampling rate against a second threshold.

* * * * *